United States Patent [19]
Suzuki et al.

[11] 4,086,500
[45] Apr. 25, 1978

[54] ADDRESS DECODER

[75] Inventors: Yasoji Suzuki, Kanagawa; Ochii Kiyofumi, Koganeishi, both of Japan

[73] Assignee: Tokyo Shibaura Electric Co., Ltd., Japan

[21] Appl. No.: 747,975

[22] Filed: Dec. 6, 1976

[30] Foreign Application Priority Data
Dec. 5, 1975 Japan .................. 50-143908

[51] Int. Cl.² ............ G11C 8/00; H03K 19/08; H03K 19/20; H03K 17/04
[52] U.S. Cl. .................. 307/270; 307/205; 307/215; 307/DIG. 5; 365/230
[58] Field of Search ............ 307/205, 215, 238, 270, 307/251, DIG. 5; 340/173 R

[56] References Cited
U.S. PATENT DOCUMENTS

| | | | |
|---|---|---|---|
| 3,644,904 | 2/1972 | Baker | 307/238 X |
| 3,721,838 | 3/1973 | Brickman et al. | 307/205 X |
| 3,778,782 | 12/1973 | Kitagawa | 307/205 X |
| 3,778,784 | 12/1973 | Karp et al. | 307/238 X |
| 3,863,230 | 1/1975 | Regitz et al. | 307/205 X |
| 3,906,461 | 9/1975 | Cappon | 307/238 X |
| 3,911,428 | 10/1975 | Chin | 307/205 X |
| 3,959,781 | 5/1976 | Mehta et al. | 307/DIG. 5 X |

Primary Examiner—Larry N. Anagnos
Attorney, Agent, or Firm—Oblon, Fisher, Spivak, McClelland & Maier

[57] ABSTRACT

An address decoder comprises an OR circuit and a NOR circuit, the OR circuit having switching transistors to which decoder inputs and a chip enable signal are applied, a load transistory and a transistor for precharging a common precharge node by the complementary chip enable signal. The output of this OR circuit is applied to the NOR circuit with the complementary chip enable signal, the set-up time of the decoder or the NOR circuit being independent of the number of decoder inputs.

5 Claims, 7 Drawing Figures

ADDRESS DECODER

BACKGROUND OF THE INVENTION

1. Field of the Invention

This invention relates generally to complementary Metal Oxide Semiconductor Field Effect transistor (CMOSFET) memory devices and, more particularly, relates to an improved address decoder for CMOS random access memories and the like.

2. Description of the Prior Art

CMOS memory devices consisting of P channel MOSFET and N channel MOSFET are well-known; there are two types that is to say the dynamic type memory device and the static type memory device. But the static type memory device is mostly used, because of the low power consumption, and recently large scale semiconductor memories such as 1 K bits memories have been developed. In many cases, a plurality of the abovementioned memory devices are combined to obtain a large scale semiconductor memory apparatus.

Now, as regards the complementary MOSFET circuits, there are many cases in which the switching characteristics become slow as compared with MOS N channel or P channel type MOS circuits. Now, the access time $t_{ACC}$ of a semiconductor memory device can be regarded as the sum of the propagation delays of the various circuit blocks making up the memory device, and can be expressed by the following equation, $$t_{ACC} = A(t) + C(t) + S(t) + O(t) \tag{1}$$

In this equation, $A(t)$ is the propagation delay of the address line and decoder circuit, $C(t)$ is the time for data read-out to the common bus line of the memory cells, $S(t)$ is a time dependent on the sense sensitivity of the sense circuit and $O(t)$ is the delay time in the output circuit.

Now, two conventional types of CMOS address decoder circuits are known. Firstly, a static type one is constructed with load MOS transistors connected in parallel and switching MOS transistors connected in series, and decoder inputs are applied to the gate electrodes of the switching MOS transistors. Secondly, a semidynamic type one comprises a load MOS transistor for static operation, a precharge MOS transistor for dynamic operation and switching MOS transistors connected in series, and the decoder inputs are applied to the gate electrodes of the switching transistors.

Thus, the abovementioned two types of the decoder circuits are AND circuits in which when these circuits are set up, the imparted charge is discharged through multi-stage series MOS transistors, and therefore the set-up time during which the decoder circuits are being set up becomes long and causes $A(t)$ in Equation (1) to increase. Furthermore, as the number of memory bits increases, the number of stages in the decoder input becomes greater and the decoder set-up time unavoidably becomes progressively longer.

SUMMARY OF THE INVENTION

Accordingly, one object of this invention is to provide CMOS memory devices with a short access time.

Another object of this invention is to provide a CMOS decoder circuit in which the decoder set-up time is short.

Yet another object of this invention is to provide a CMOS decoder circuit suitable for large scale semiconductor memories.

A still further object of this invention is to provide an improved CMOS decoder circuit whose set-up time is independent of the number of the decoder inputs.

Briefly, in accordance with the present invention, the foregoing and other object are attained by the provision of an address decoder circuit which includes an OR circuit and NOR circuit. Decoder inputs, a chip enable signal and the complementary chip enable signal are applied to the OR circuit, and whose output and complementary chip enable signal are applied to the NOR circuit. The set up time of the output of NOR circuit, namely, the decoder output is independent of the decoder inputs.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

There will now be explained a CMOS decoder circuit according to one embodiment of this invention with reference FIGS. 1 to 4.

Figure 1:
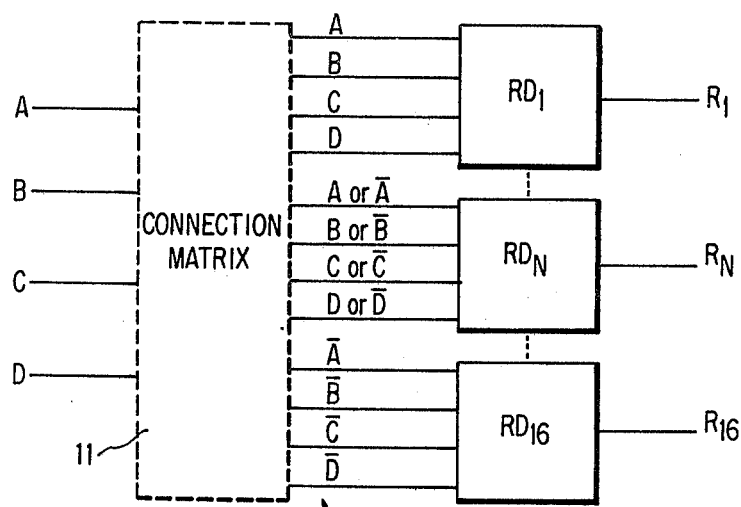
FIG. 1 is a block diagram showing an address decoder according to this invention.
Figure 2:
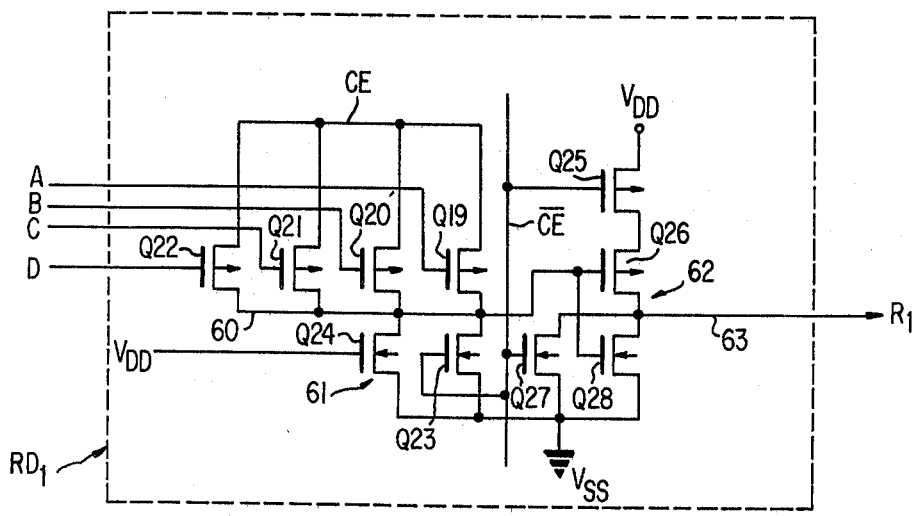
FIG. 2 is a schematic circuit diagram showing a CMOS decoder circuit according to this invention.

In FIG. 1, a decoder circuit is indicated generally by the reference numeral 10. The circuit 10 is illustrated as having four decoder inputs A through D, which are applied through a connection matrix (11) to 16 row decoders $RD_1 - RD_{16}$, with each combination of four logic inputs being unique for each row decoder. As a result, only one of the row output lines $R_1 \sim R_{16}$ will be at a logic "1" level at any time, as will hereafter be described. The connection matrix (11) is hard wired, but the connections are not illustrated in detail. Similarly, only four row decoders $RD_1$, $RD_n$ and $RD_{16}$ are illustrated in FIG. 1. A row decoder $RD_1$ of a semidynamic type according to this invention is shown in FIG. 2. The source electrodes of P channel MOS transistors $Q_{19}$ to $Q_{22}$ are connected to the chip enable signal line CE in parallel. The chip enable signal CE is used to select only a single memory device from many arranged ones forming a large scale memory apparatus. Decoder inputs A to D are connected to the respective gate electrodes of these transistors. On the other hand, the drain electrodes of transistors $Q_{19}$ to $Q_{22}$ are connected to a common precharge node (60) and N channel MOS transistors $Q_{23}$, $Q_{24}$ are connected between the common precharge node (60) and a power source $V_{SS}$ in parallel. A voltage $V_{DD}$ and a complementary chip enable signal $\overline{CE}$ are applied to the gate electrodes of transistors $Q_{24}$ and $Q_{23}$ respectively. These transistors $Q_{19}$ to $Q_{24}$ form an OR circuit (61), whose output is delivered out of the common precharge line (60). In this OR circuit (61), a timing is given so that the common precharge line (60) is charged (what is known as precharge operation) by the transistor $Q_{23}$, before address decoder inputs A to D are applied to transistors $Q_{19}$ to $Q_{22}$. The precharging is carried out by applying the chip enable signal to the gate electrode of transistor $Q_{23}$. The transistor $Q_{24}$ is a load transistor for making the decoder circuit operate semistatically. If the transistor $Q_{24}$ is absent, this decoder will become a completely dynamic type, but logically static operation is made possible by the load transistor operation of transistor $Q_{24}$.

On the other hand, a NOR circuit (62) is made up of the transistors $Q_{25}$ to $Q_{28}$, in which transistors $Q_{25}$ and $Q_{26}$ are P channel type and transistor $Q_{27}$ and $Q_{28}$ are N channel type. The transistors $Q_{25}$ and $Q_{26}$ are connected in series, the source electrode of the transistor $Q_{25}$ is connected to a power source $V_{DD}$ and the drain electrode of transistor $Q_{26}$ is connected to a decoder output node (63). Transistors $Q_{27}$ and $Q_{28}$ interconnected in parallel are connected between the decoder output node (63) and a power source $V_{SS}$. The complementary chip enable signal $\overline{CE}$ is applied to the gate electrodes of transistors $Q_{25}$ and $Q_{27}$, and the output of OR circuit (61) is applied to the gate electrodes of transistors $Q_{26}$ and $Q_{28}$.

Figure 3:
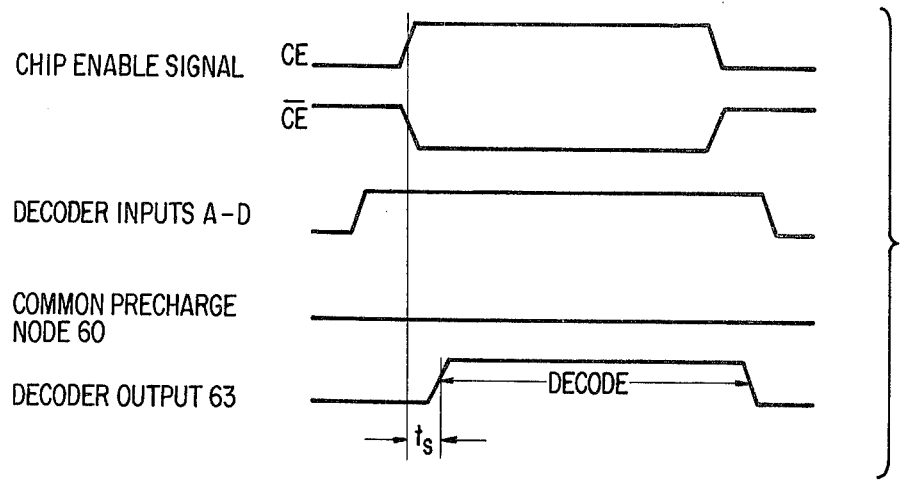
FIGS. 3 and 4 are timing diagram of pulses showing operations of the circuit showned in FIG. 2.
Figure 4:
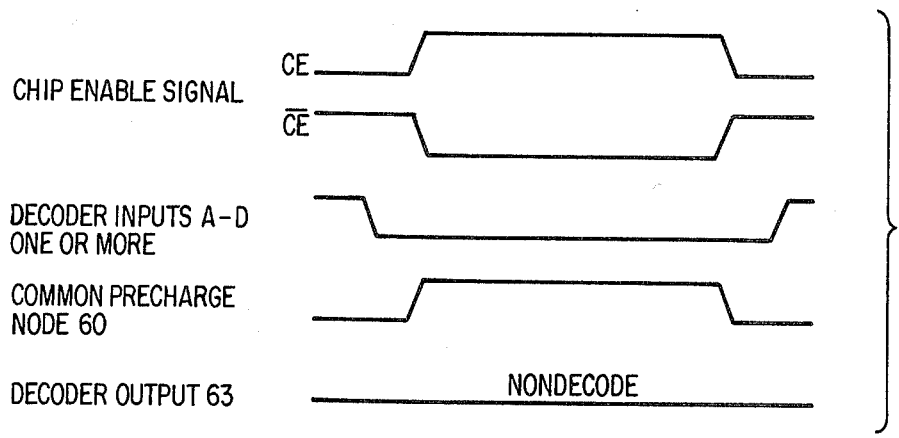

Referring now to FIGS. 3 and 4, the explanation of the circuit operation shown in FIG. 2 will be made.

Firstly, the common precharge line (60) is precharged by transistor $Q_{23}$ before the decoder inputs are applied. As shown in FIG. 3 only in the case in which the decoder inputs A to D have all become logical "1", and all the transistors $Q_{19}$ to $Q_{22}$ are rendered nonconductive, does the negative electric charge previously imparted to the common precharge line (60) remain uncharged to the CE line. Therefore the logical state of the precharge line (60) is "0". The output of OR circuit (61) is applied to the gate electrode of transistor $Q_{26}$ and $Q_{28}$ rendering the transistors $Q_{26}$ conductive and the transistor $Q_{28}$ nonconductive. Furthermore transistor $Q_{25}$ is rendered conductive and transistor $Q_{27}$ nonconductive by the complementary chip enable signal $\overline{CE}$. As a result the current path between a power source $V_{DD}$ and the decoder output node (63) is formed, and the logical state of the output node (63) becomes "1", the decoder entering the "decode state". On the other hand, as shown in FIG. 4, when at least one decoder input of A to D is logical "0" state, the negative electric charge previously imparted to the common precharge line (60) is discharged to the CE line through one or more of the transistors $Q_{19}$ to $Q_{22}$, so that the logical state of the common precharge line (60) becomes "1". This output of the OR circuit is applied to the NOR circuit and the logical state of the decoder output node becomes "0", so that the decoder circuit enters the "non decode state". In this circuit, if a chip isn't selected, the transistor $Q_{25}$ turns off and transistor $Q_{27}$ turns on, so that the voltage potential of the decoder output becomes $V_{SS}$, namely "0" level, independent of any combination of the the decoder inputs A to D. Therefore, decoder circuits of nonselected memory devices are never set up. Now, transistors $Q_{25}$ and $Q_{26}$ also act as drivers of the decoder output, and therefore, it is necessary to make their $g_m$ value large. In FIG. 3 $t_s$ is the decoder set-up time; this is determined by the time of charging of the decoder output node (63) by the 2-stage series transistors $Q_{25}$ and $Q_{26}$. Accordingly, the set-up time is completely independent of the number of decoder inputs, which is very suitable for decoder circuit having many logical inputs.

Figure 5:
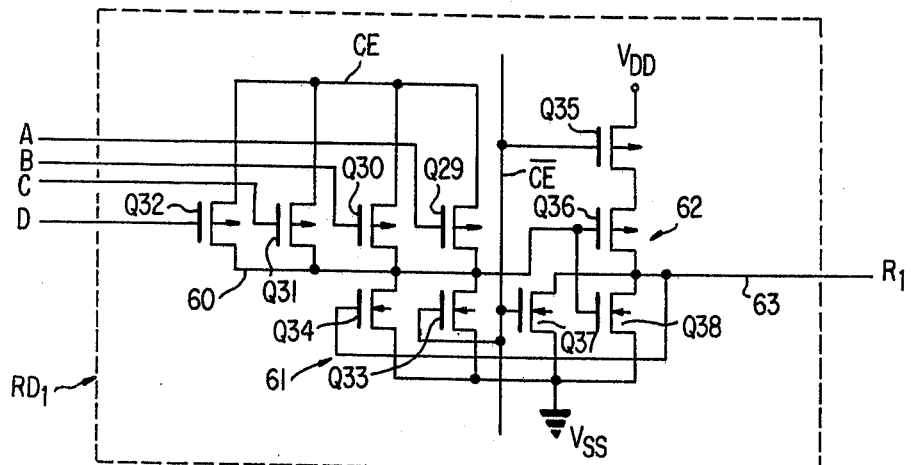
FIGS. 5 to 7 are schematic circuit diagrams showing CMOS decoder circuits according to another embodiment of this invention.

FIG. 5 shows another embodiment of this invention. In this embodiment, the gate electrode of transistor $Q_{34}$ is connected to the decoder output node (63). Namely, the load transistor $Q_{34}$ of only the set-up decoder circuit turns on. Accordingly the power consumption becomes small.

Figure 6:
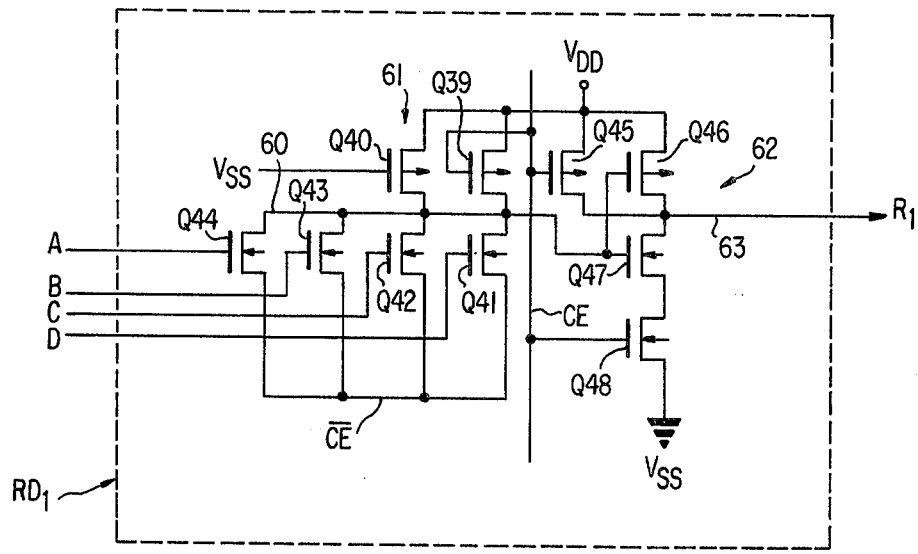

FIG. 6 shows further another embodiment according to this invention. The channel type of MOS transistors which form the circuit are opposite to that of MOS transistors in circuit in shown FIG. 2, and a power source $V_{DD}$ is connected to the source electrodes of transistors $Q_{39}$, $Q_{40}$, $Q_{45}$ and $Q_{46}$. Furthermore, the chip enable signal CE is applied to the gate electrodes of transistors $Q_{39}$, $Q_{45}$ and $Q_{48}$ and the complementary chip enable signal $\overline{CE}$ is applied to the source electrodes of transistors $Q_{41}$ to $Q_{44}$. The operation of this circuit is the same as the circuit in shown FIG. 2.

Figure 7:
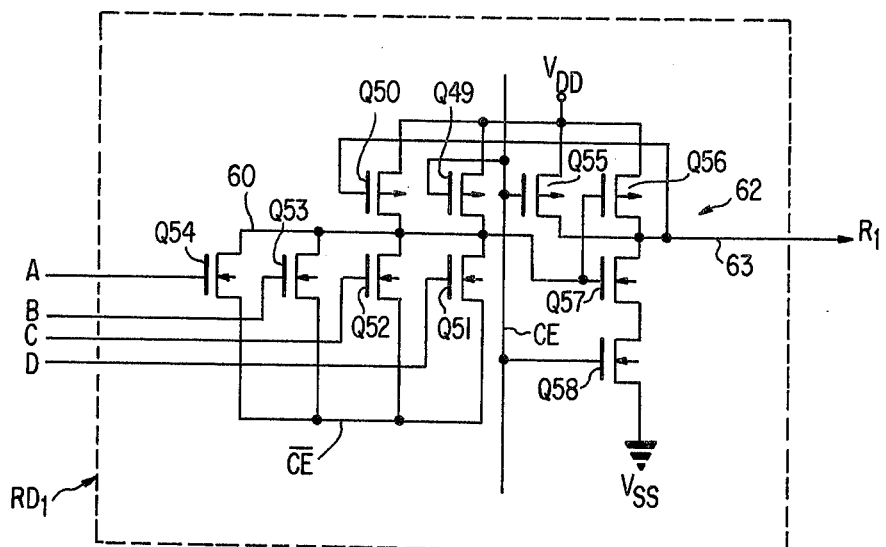

FIG. 7 shows further another embodiment of this invention, and is a modified embodiment in shown FIG. 6. The gate electrode of transistor $Q_{50}$ is connected to the decoder output node (63).

As abovementioned, according to this invention, the decoder set-up time is determined by the time of charging of the decoder output node by the 2-stage transistors, so that the set-up time is completely independent of the number of decoder inputs. Therefore it is possible to minimize the propagation delay A(t) of address decoders, which makes the access time of memory devices short.

Although this invention has been disclosed and illustrated with reference to particular applications, the principles involved are susceptible of numerous other applications which will be apparent to those skilled in the art. The invention is, therefore, to be limited only as indicated by the scope of the amended claims.

What is claimed as new and desired to be secured by letters patent of the United States is:

1. An address decoder comprising:
   a chip enable signal line;
   a complementary chip enable signal line;
   a common precharge node;
   a decoder output node;
   a first power source;
   a second power source;
   a plurality of switching MOS transistors each having a first conductivity type and a decoder input, the channels of which are connected in parallel between the chip enable signal line and the common precharge node;
   first and second MOS transistors having a second conductivity type and connected between the common precharge node and the first power source in parallel, the first MOS transistor being for use as a load transistor and the gate electrode of the second MOS transistor being connected to the complementary chip enable signal line for precharging the common precharge node;
   third and fourth MOS transistors having the first conductivity type and connected between the second power source and the decoder output node in series, the gate electrode of the third transistor being connected to the complementary chip enable line, the gate electrode of the fourth MOS transistor being connected to the common precharge node; and fifth and sixth MOS transistors having the second conductivity type and connected between the decoder output node and the first power source in parallel, the gate electrode of the fifth MOS transistor being connected to the complementary chip enable signal line and the gate electrode of the sixth MOS transistor being connected to the common precharge node.

2. An address decoder as in claim 1 wherein the first conductivity type is P type and the second conductivity type is N type, and the gate electrode of the first transistor is connected to the second power source.

3. An address decoder as in claim 1 wherein the first conductivity type is N type and the second conductivity type is P type, and the gate electrode of the first MOS transistor is connected to the second power source.

4. An address decoder as in claim 1 wherein the gate electrode of the first MOS transistor is connected to the decoder output node.

5. An address decoder as in claim 1 wherein the values of conductance $g_m$ of the third and fourth MOS transistors are determined so that these transistors form a driver circuit for the decoder circuit.

* * * * *